United States Patent [19]

Nakajima

[11] Patent Number: 5,101,461
[45] Date of Patent: Mar. 31, 1992

[54] OPTICAL FIBER AMPLIFIER APPARATUS
[75] Inventor: Yasuo Nakajima, Itami, Japan
[73] Assignee: Mitsubishi Denki Kabushiki Kaisha, Japan
[21] Appl. No.: 584,774
[22] Filed: Sep. 19, 1990
[30] Foreign Application Priority Data Apr. 18, 1990 [JP] Japan .................. 2-102635

[51] Int. Cl.$^5$ .................. G02B 6/26; H01S 3/30; G02F 1/00
[52] U.S. Cl. .................. 385/42; 385/30; 385/38; 385/128; 385/14; 372/6; 372/7; 372/49; 372/50; 372/99; 359/173; 359/174
[58] Field of Search .................. 350/96.11, 96.12, 96.15, 350/96.17, 96.20, 311; 372/6, 7, 48, 49, 50, 107, 108, 99; 455/601, 608, 609, 610

[56] References Cited

U.S. PATENT DOCUMENTS

| | | | |
|---|---|---|---|
| 4,072,400 | 2/1978 | Claypoole et al. | 350/96.30 |
| 4,507,775 | 3/1985 | Sheem | 455/608 X |
| 4,546,476 | 10/1985 | Shaw et al. | 372/6 |
| 4,723,824 | 2/1988 | Shaw et al. | 350/96.15 |
| 4,959,837 | 9/1990 | Février et al. | 372/6 |
| 4,979,234 | 12/1990 | Agrawal | 455/608 |
| 5,005,175 | 4/1991 | Desurvire et al. | 372/6 |
| 5,015,054 | 5/1991 | Chaffee | 350/96.15 |
| 5,023,885 | 6/1991 | Auracher et al. | 372/6 X |
| 5,027,079 | 6/1991 | Desurvire et al. | 372/6 X |

OTHER PUBLICATIONS

Mears et al., "High-Grain . . . 1.54 μm", OFC/IOOC, WI2 (1987), pp. 1025-1026.
Mears et al., "Low-Noise . . . 1.54 μm", Electronics Letters, vol. 23, No. 19, 1987, pp. 1026-1028.
Hagimoto et al., "A 212 km . . . Repeater System", OFC 1989, pp. PD15-1-PD15-4.
Vodhanel et al., "Highly Efficient 978 nm . . . 24 dB Gain", Electronics Letters, 1989, vol. 25, No. 20, pp. 1386-1388.
Laming et al., "Efficient Pump . . . Optical Amplifier", Electronics Letters, 1989, vol. 25, No. 1, pp. 12-14.

Primary Examiner—Brian Healy
Attorney, Agent, or Firm—Leydig, Voit & Mayer

[57] ABSTRACT

An optical amplifier apparatus which amplifies a signal light in an optical fiber includes an optical fiber having a core containing a rare-earth dopant element and an excitation light source including a semiconductor laser for generating excited light and an optical amplifier utilizing a semiconductor laser for amplifying the excited light and supplying the amplified excited light to the optical fiber.

6 Claims, 8 Drawing Sheets

OPTICAL FIBER AMPLIFIER APPARATUS

FIELD OF THE INVENTION

The present invention relates to an optical amplifier apparatus which is essential to an optical communication system, and more particularly to the enhancement of the efficiency and reliability of the optical amplifier apparatus.

BACKGROUND OF INVENTION

As an optical amplifier which directly amplifies an optical signal, there are a semiconductor laser amplifier utilizing a semiconductor laser such as a Fabry-Perot type semiconductor optical amplifier or a traveling wave type optical amplifier (hereinafter referred to as laser diode (LD) amplifier), and an Er doped optical fiber amplifier which comprises a core of optical fiber into which erbium as rare-earth element is doped.

Figure 3A:
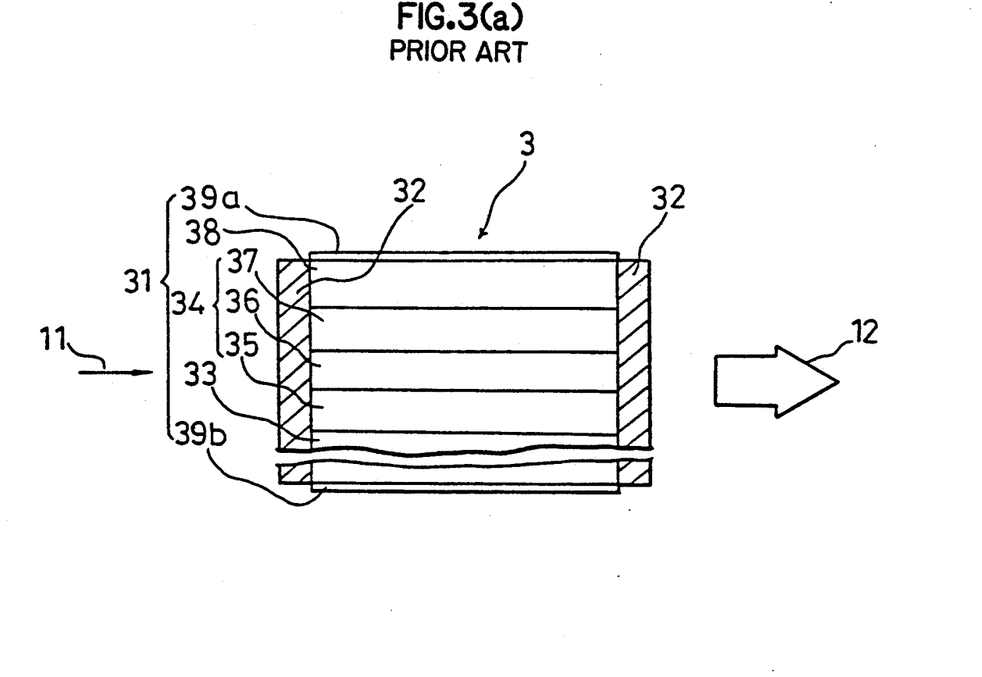
FIGS. 3(b) to 3(g) show characteristics of the amplifier of FIG. 3(a)

FIG. 3(a) shows a conventional traveling waveguide type optical amplifier. FIG. 3(a) shows a cross-sectional structure and FIGS. 3(b) to 3(g) show the characteristics thereof. In FIG. 3(a), reference numeral 3 designates a traveling waveguide type optical amplifier which receives signal light 11 of a wavelength λ and outputs the amplified output light 12. This traveling waveguide type optical amplifier has a structure which is obtained by coating both facets of the semiconductor laser section 31 with a low reflectance film 32.

The above described semiconductor laser section 31 has a laminated structure which is obtained by producing an n type InP cladding layer 35, an InGaAsP active layer 36, a p type InP cladding layer 37 and a p type InGaAsP contact layer 38 on an n type or p type InP substrate 33 about 80 microns in thickness and producing a p side electrode 39a and an n side electrode 39b at the surface side and the rear surface side of the substrate. The total thickness of the laser section 31 is about approximately 100 microns. Here, the active layer 36 and the cladding layers 35 an 37 constitute a waveguide 34 of the above described semiconductor laser section 31.

The low reflectance film 32 is obtained by producing a silicon oxide film or a silicon nitride film at the facet of the semiconductor laser section 31 to a film thickness of λ/4 and lowers the reflectance at the facet of the semiconductor laser section 31 to approximately 1%. This is because the semiconductor laser section 31 itself has a reflectance at the facet of approximately 30%, so that it constitutes a resonant structure and functions as a laser oscillator unless the reflectance at the facet is lowered.

Figure 3B:
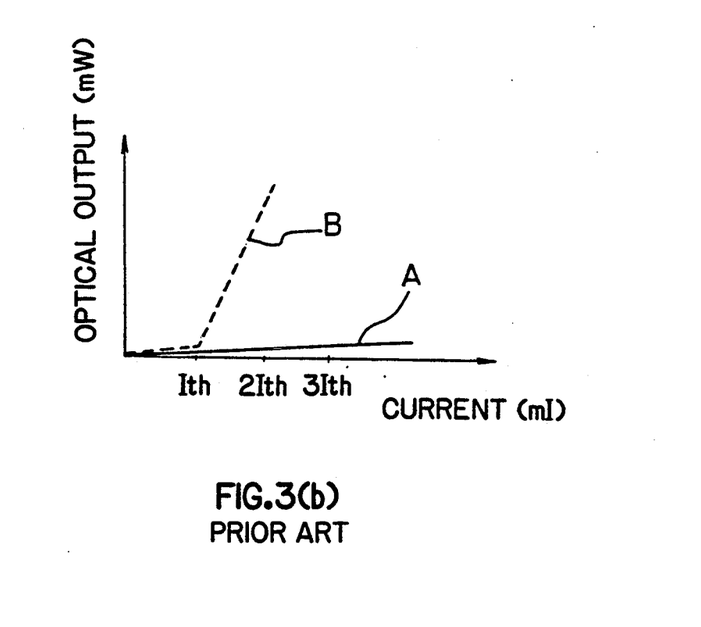

FIG. 3(b) shows an optical output—current characteristics. In figure, the line A shows a characteristic of this traveling waveguide optical amplifier 3, that is, the semiconductor laser section 31 on which a low reflectance film is coated, the dotted line B shows a characteristic of a semiconductor laser section 31 on which low reflectance film is not coated, and reference character Ith designates a threshold of laser oscillation.

An operation will be described.

A signal light 11 is collected by using a lens system (not shown) and put into the built-in waveguide 34 of the semiconductor laser section 31. When two or three times the current of the threshold current value Ith flows before low reflectance film coating is applied to the semiconductor laser section 31, induced emission occurs and the power of the signal light 11 gradually increases along the waveguide 34. Amplication of the signal light 11 is carried out and output light 12 which is amplified is obtained. Here, since the semiconductor laser section 31 is subjected to a low reflectance coating at the both sides facets, it has characteristics as shown by line A, that is, it does not oscillate.

Here, the Fabry-Perot type semiconductor optical amplifier has the same structure as that of the semiconductor laser section 31, and this is biased below the threshold Vth. However, since there are a lot of problems in characteristics such as the small signal gain, this type of amplifier is not frequently used at present.

Figure 4:
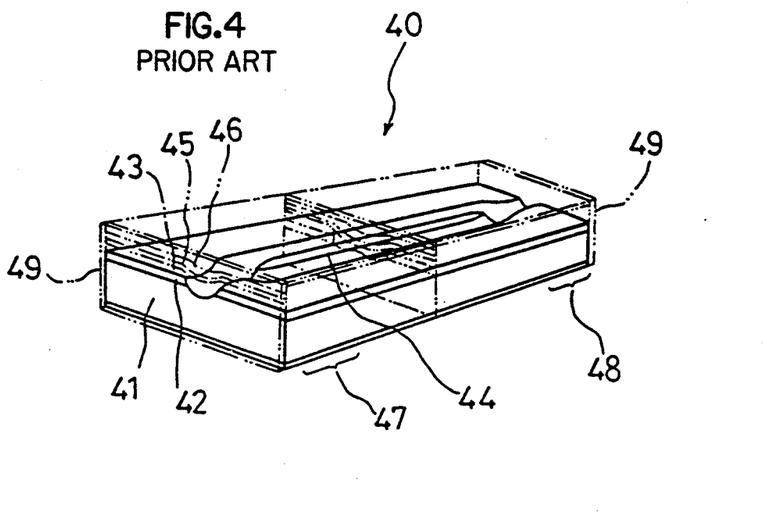
FIG. 4 is a diagram showing a prior art traveling wave type optical amplifier having a window region.

FIG. 4 shows another example of a traveling waveguide type semiconductor optical amplifier shown in OQE-89 P49, and in this kind of amplifier, the remaining facet reflectance is intended to be reduced by providing a window region at both facets of the active region of a semiconductor laser.

That is, at a central portion of the n type InP substrate 41, an island region 44 comprising a substrate region 41 as an n type cladding layer, an InGaAsP layer 42 as an active layer, and an InP layer 43 as a p type cladding layer is produced. At the both end portions of the substrate 41, window regions 47, 48 of a structure in which a p type InP layer 43, an n type InP layer 45 and a p type InP layer 46 are laminated on the n type InP substrate 41 are produced. Furthermore, a low reflectance film 49 is produced at the both facets of the substrate 41.

Figure 5A:
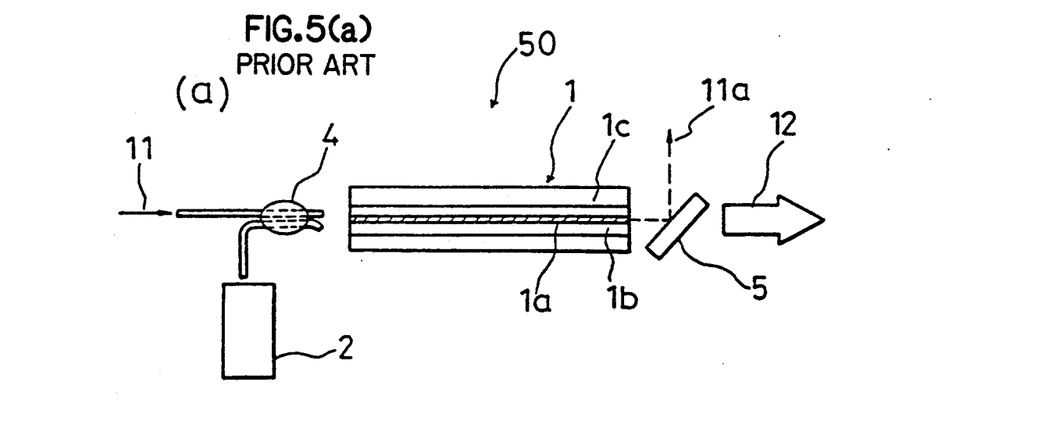
FIG. 5(a) is a diagram showing a prior art optical fiber amplifier.
Figure 5B:
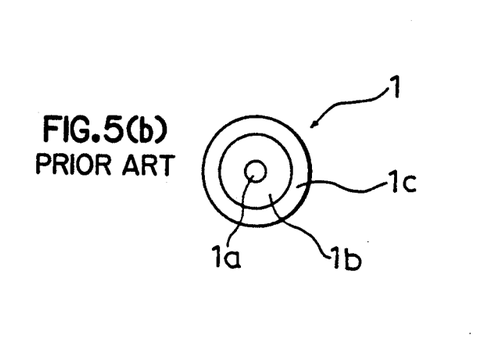
FIG. 5(b) is a cross-sectional view of an optical fiber.
Figure 5C:
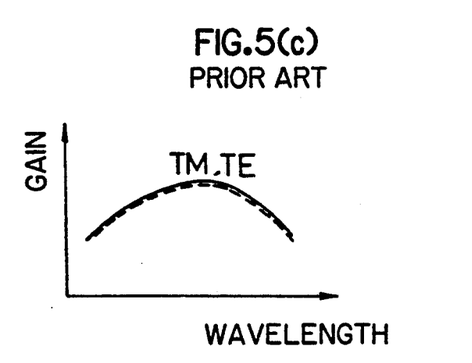
FIG. 5(c) to 5(e) show characteristics of the amplifier of FIG. 5(a)
Figure 5D:
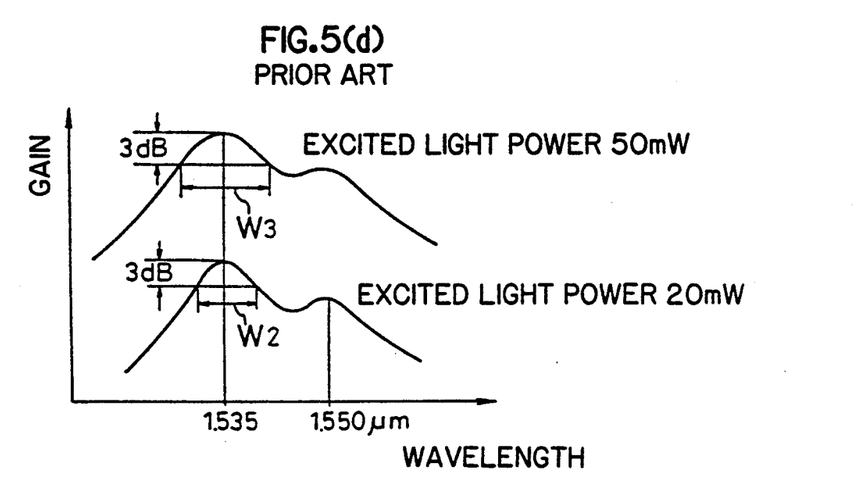
Figure 5E:
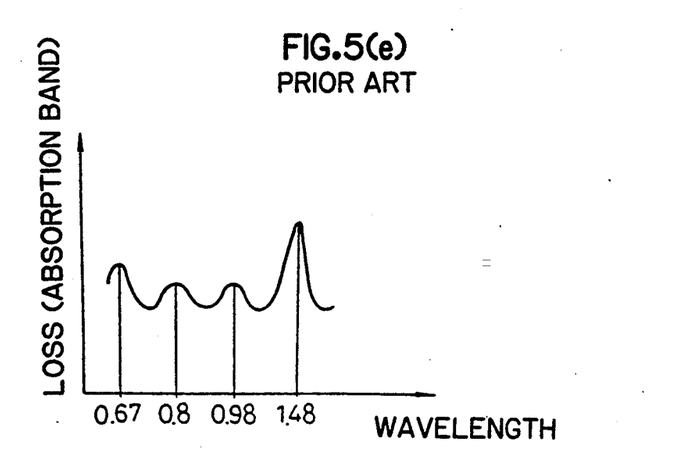

In addition, FIGS. 5(a) and 5(b) show another example of a conventional optical amplifier such as an Er doped optical fiber amplifier which is recited in OplusE No. 113 P75. FIG. 5(a) shows a schematic construction of the conventional optical amplifier, FIG. 5(b) shows a cross-sectional structure of an optical fiber thereof, and figures 5(c) to 5(e) show the characteristics thereof. In FIGS. 5, reference numeral 50 designates an Er doped optical fiber amplifier which comprises an Er doped optical fiber 1, a semiconductor laser (hereinafter referred to as 'LD') 2 as an excitation light source of the optical fiber 1, a coupler 4 for coupling the signal light 11 and the excited light, and a filter 5 for separating the amplified light 12 and the excited light 11a.

The above-described optical fiber 1 is constituted of a core 1a which comprises core material of silicon dioxide ($SiO_2$) to which erbium (Er) is doped, a cladding layer 1b comprising such as glass fiber for covering the core 1a, and a protecting film 1c covering the surface of the cladding layer 1b. The semiconductor laser 2 has the same structure as that of the semiconductor laser section 31 of the above-described traveling wave type optical amplifier. The coupler 4 is provided between the semiconductor laser 2 and the optical fiber 1 and th filter 5 is arranged at the light output side of the optical fiber 1.

In the Er doped optical fiber amplifier of such construction, when signal light 11 enters the optical fiber 1 in a state where the Er atom in the core 1a of the optical fiber 1 is excited to a high energy level by the excited light (wavelength 1.48 microns) of the semiconductor laser 2, an induced emission occurs and the power of the signal light 11 increases gradually along the optical fiber 1 and the amplification of signal light 11 is carried out.

Here, there are a plurality of absorption bands in the Er doped optical fiber 1 as shown in FIG. 5(e) and they can be all utilized as the wavelength of excited light, and the bands of 0.67 microns, 0.98 microns, and 1.48 microns are generally favorable. In addition, as an excitation light source, a dye laser or a gas laser may be utilized instead of a semiconductor laser.

In addition, this optical fiber amplifier has characteristics such as low noise, no dependency of the gain on polarization, and less coupling loss with a transmission line than an LD amplifier using a semiconductor laser.

The characteristics of the semiconductor laser amplifier (LD amp) and an optical fiber amplifier (FA amp) are shown by comparison in the following table.

TABLE

|  | LD amp | FA amp |
| --- | --- | --- |
| wavelength in use | 0.8~1.6 microns | 1.55 microns |
| 3dB band width | 70nm | 5nm |
| gain | ~20dB | ~35db |
| saturated output | ~several tens of mW | ~1mW |
| dependency on polarization | exist | none |
| coupling loss | ~6dB | ~0dB |
| excited current/light | current 10mA~ | light 20mW~ |
| dependency on temperature | exist | none |
| noise characteristics | exist | none |
| element length | ~500 microns | ~10 m |

These differences in such characteristics are due to the difference between the structure of LD amplifier and that of FA amplifier. The width of wavelength λ of the signal light and the 3 dB band width are determined by the composition of the active layer and the gain and the saturated output can be increased by increasing the element length, the excited current and the excited light.

Figure 3C:
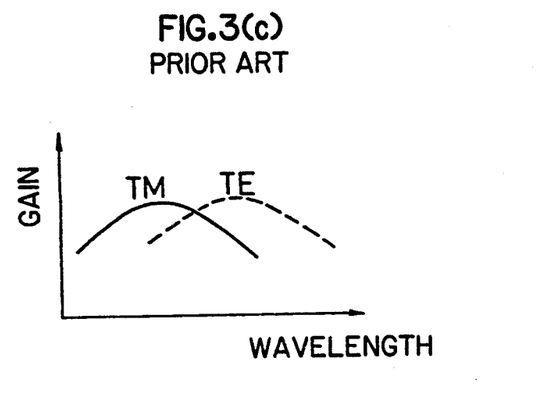
Figure 3D:
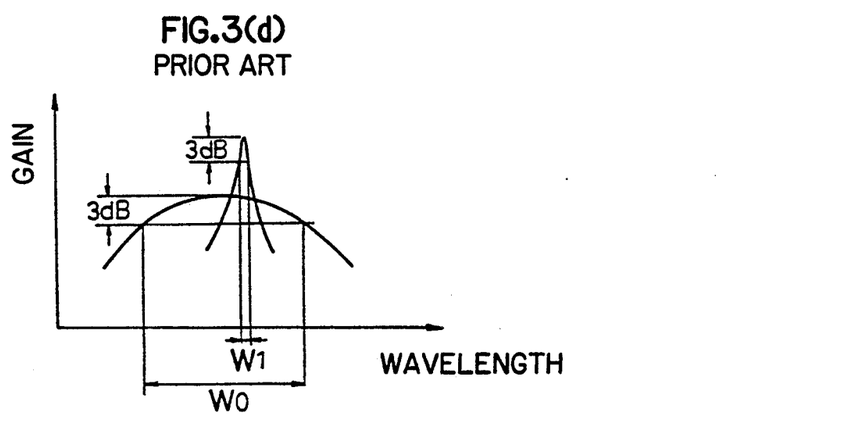

As for the dependency on polarization, there is a deviation between TM mode and TE mode in the output light as shown in FIG. 3(c) for the LD amplifier, while in the FA amplifier, the different polarization modes coincide with each other as shown in FIG. 5(c).

As for the coupling loss, in the LD amplifier, it is necessary to collect the transmission light by a lens, and the coupling loss becomes approximately 6 dB, while in the FA amplifier, the coupling is between optical fibers, thereby resulting in almost no loss.

Figure 3E:
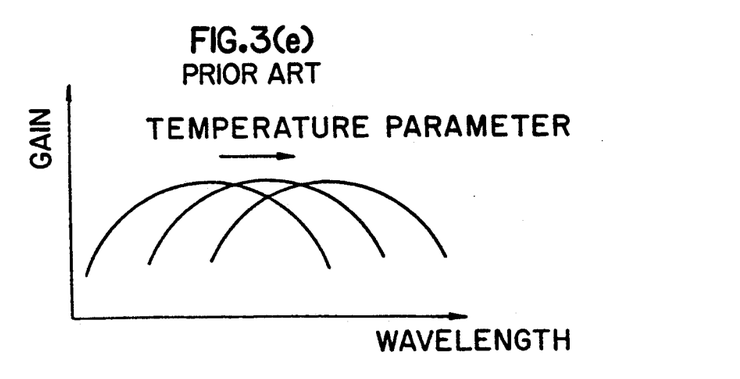
Figure 3F:
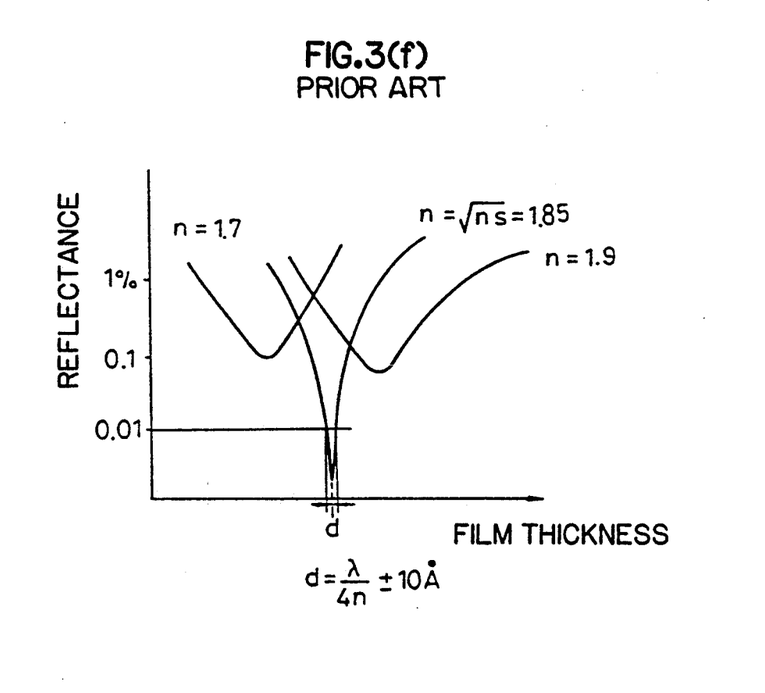
Figure 3G:
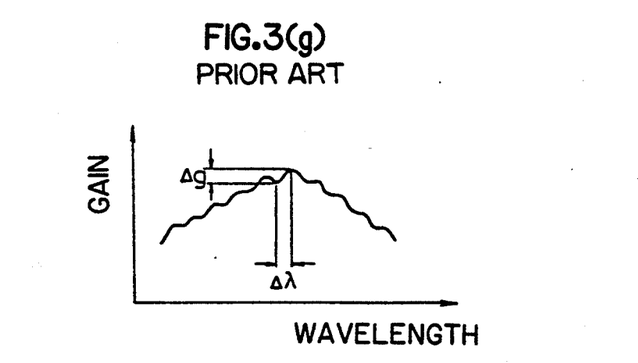

In addition, there is a dependency on temperature in the LD amplifier because this LD amplifier comprises semiconductor material (refer to FIG. 3(e)).

This comparison shows that except for the wavelength which can be used as a signal light, and 3dB gain band width and saturated output, the optical fiber amplifier is superior to the LD amplifier. In addition, the modification of the kind and amount of rare-earth dopant element in the optical fiber improved the wavelength of the signal light and 3dB gain band width, and the increased excited light power further enhanced the gain and the saturated output.

As a method for increasing the excited light power, one intending to enhance the outputs by polarization multiplying of two LD amplifiers is shown in Japanese Patent Laid-Open Publication No. 63-115154.

An application example of an optical amplification system utilizing the above-described optical amplifier will be described with reference to FIGS. 6(a) to 6(c).

Figure 6A:
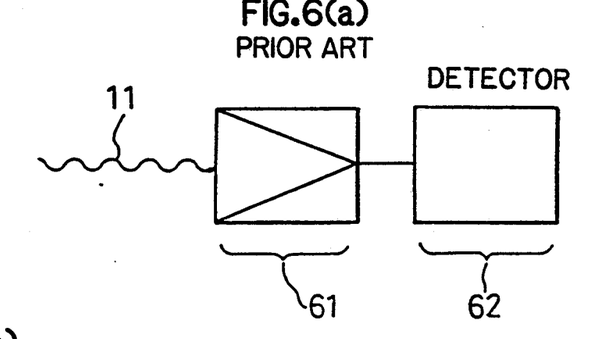
FIGS. 6(a) to 6(c) are diagrams showing application examples of a prior art optical amplifier.

FIG. 6(a) shows an example of optical pre-amplifier which amplifies the signal light 11 directly before the detector 62. In a case where the signal source is located far away, the signal light 11 is attenuated by transmission path and therefore it is erroneously detected at the detector 62. In such a case, an amplifier 61 is arranged directly before the detector 62, and the attenuated signal light 11 is amplified directly before the detector 62, thereby to prevent the erroneous detection and improve the receiving sensitivity.

Figure 6B:
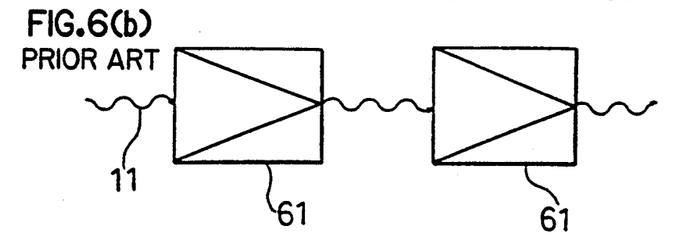

FIG. 6(b) shows a construction of an optical amplifier repeater which directly amplifies the signal light which is transmitted and attenuated in the optical fiber and again sends it out to the optical fiber. Here, optical amplifiers 61 are arranged on a transmission path comprising optical fibers (not shown), at predetermined intervals, and the transmitted light which is amplified by the optical amplifier 61 extends the regenerative repeating interval, that is transmission distance.

Figure 6C:
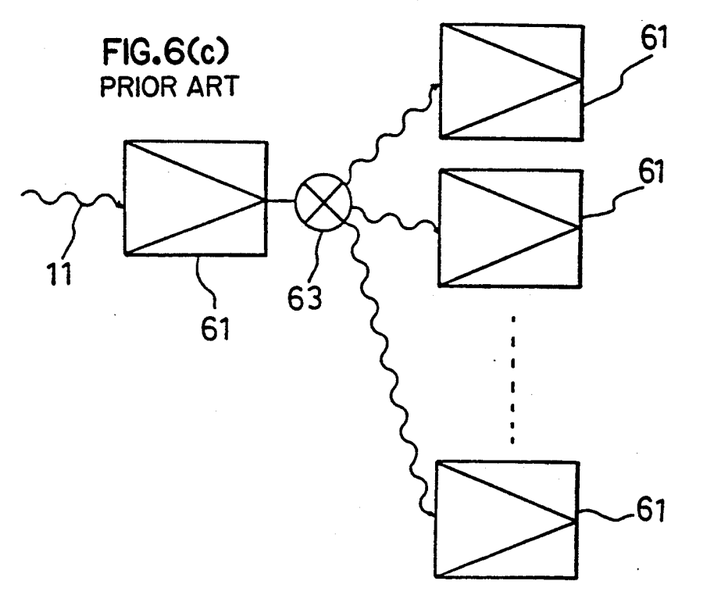

FIG. 6(c) shows an optical booster amplifier for compensating element insertion loss and optical branching loss in an optical circuit and it is possible to obtain a large sized optical signal processing system in which the size is not restricted by the optical loss. That is, an optical amplifier 61 is arranged at the former or latter stage of an optical branch (optical switch) 63 which branches the signal light 11 and the input signal light 11 is amplified and the branched output light 11b is amplified.

In order to obtain an optical amplifier which can satisfy these uses, the following are required:
(1) small signal gain is larger than 20dB
(2) the gain band width is wide
(3) the signal gain does not depend on the plane of polarization
(4) saturation gain is large
(5) low noise In addition, it is necessary to have a reliability of about one hundred thousand hours similarly as in the semiconductor laser.

However, in the optical amplifier of FIG. 3(a) which is obtained by low reflectance film coating of both facets of the semiconductor laser, there are following problems.

Firstly, unless the facet reflectance is suppressed to be below 0.01%, a resonant structure is constructed by the residual facet reflectance and the gain band width becomes width $W_1$, and it becomes narrower than the width $W_0$ in a case where the resonant structure is not produced. (refer to FIG. 3(d)).

Secondly, the gain largely changes relative to the temperature and the wavelength of the traveling light (refer to FIG. 3(e)).

Thirdly, the saturated output light intensity is low.

As a fourth problem, in order to achieve a non-reflection coating of reflectance of below 0.01%, the tolerance on the refractive index and film thickness of the film used for the non-reflection coating is quite severe, and a non-reflection film cannot be obtained stably and easily. In other words, supposing that the refractive index of the active layer be $n_s$, the refractive index of the low reflection coating film has to satisfy the relation of $n = \sqrt{n_s}$, usually $n_s$ is approximately 3.4, so that the value X of $SiO_x$ and $SiN_x$ which constitute the low reflection coating film have to be adjusted so that the n is approximately in a range of 1.85±0.01. Furthermore, the film thickness d of the low reflection coating film has to be approximately $\lambda/4n \pm 10$ angstroms (refer to FIG. 3(f)).

Furthermore, in the traveling wave type semiconductor optical amplifier having a window region shown in FIG. 4, by using a window structure, it is possible to suppress the facet reflectance to be below 0.015, but it was really difficult to produce a semiconductor laser having a window structure with high reproducibility due to the complexity in the structure.

In addition, in an optical fiber amplifier using an optical fiber with a rare-earth element dopant such as Er, a dye laser, a gas laser, and a semiconductor laser are used as an excitation light source, but in all of those except the semiconductor laser the apparatus becomes unfavorably large. Furthermore, as shown in FIG. 5(d), although the gain band width is $W_2$ at an excitation light power of 20 mW, the gain band width becomes $W_3$ ($> W_2$) at an excitation light power 50 mW, and in order to increase the gain and obtain a wide band width, the excitation power has to be increased. As for the above-described semiconductor laser, the semiconductor laser itself is at stage of research for 0.67 microns and 0.98 microns band, there is no semiconductor laser which can be used as the excitation light source. In 1.48 microns band, there is a semiconductor laser having a light output of about 100 mW. However, when it is used at a power output above 100 mW, sufficient reliability is not obtained relative to a light output level (~10 mW) which has been used in the optical communication until now.

In a method of obtaining high output by polarization multiplying of two LD amplifiers as recited in Japanese Patent Laid-Open Publication No. 63-115154, in order to obtain an output of 100 mW,, one LD has to be at 50 mW and this also results in a problem in reliability.

SUMMARY OF THE INVENTION

The present invention is directed to solving the above described problems and has for its object to provide an optical amplifier apparatus having characteristics of low noise, no dependency of gain on polarization, a high gain in a wide band, and a high coupling efficiency with a transmission line, and further being capable of easy production and sustaining high reliability.

Other objects and advantages of the present invention will become apparent from the detailed description given hereinafter; it should be understood, however that the detailed description and specific embodiment are given by way of illustration only, since various changes and modifications within the spirit and the scope of the invention will become apparent to those skilled in the art from this detailed description.

In accordance with the present invention, an excitation light source of an optical fiber optical amplifier to which rare-earth is doped comprises a semiconductor laser which generates an excited light and a semiconductor laser optical amplifier which amplifies the excited light.

In accordance with a present invention, a semiconductor laser can be used at a low level, therefore the reliability is enhanced. Further, since the excited light is amplified by a semiconductor laser amplifier, the excited light power increases and thereby the gain can be increased and the gain band width can be widened.

Since the superior characteristics of an optical fiber amplifier appear in the output light, the performance required for a semiconductor laser amplifier, is reduced and design and production are eased.

BRIEF DESCRIPTION OF THE DRAWINGS

FIG. 3(1) is a diagram showing a prior art traveling wave type optical amplifier with a non reflection coating;

DETAILED DESCRIPTION OF THE PREFERRED EMBODIMENTS

An embodiments of the present invention will be described in detail with reference to the drawings.

Figure 1:
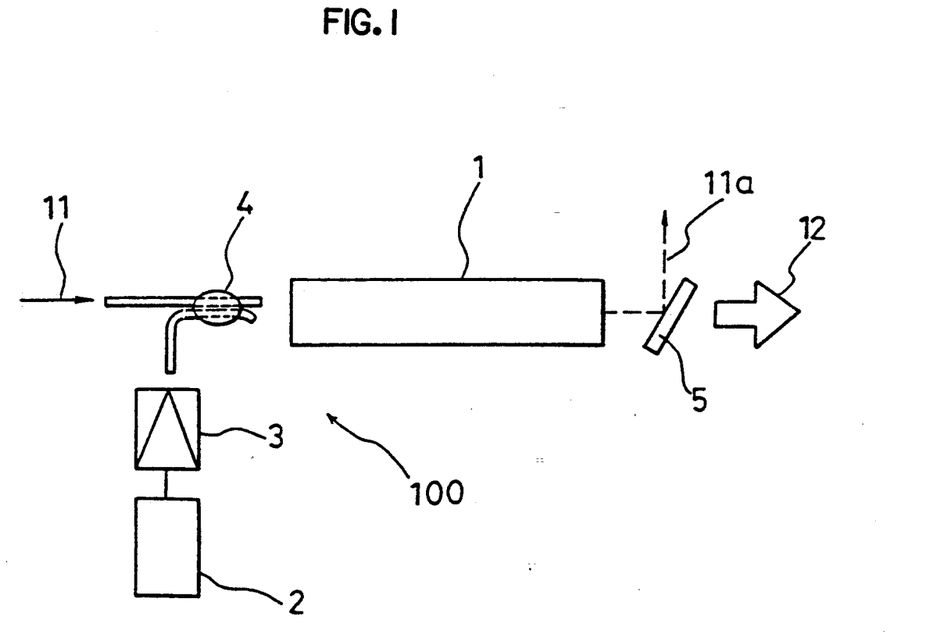
FIG. 1 is a diagram showing an optical amplifier apparatus according to an embodiment of the present invention.

FIG. 1 is a schematic view showing an optical amplifier apparatus according to an embodiment of the present invention. In FIG. 1, the same references as those shown in FIG. 5(a) and 5(b) designate the same or corresponding portions. Reference numeral 100 designates an optical fiber amplifier apparatus and the excitation light source of the optical fiber amplifier apparatus 100 comprises a semiconductor laser 2 which generates an excited light and a semiconductor laser amplifier 3 which amplifies the excited light.

Figure 2A:
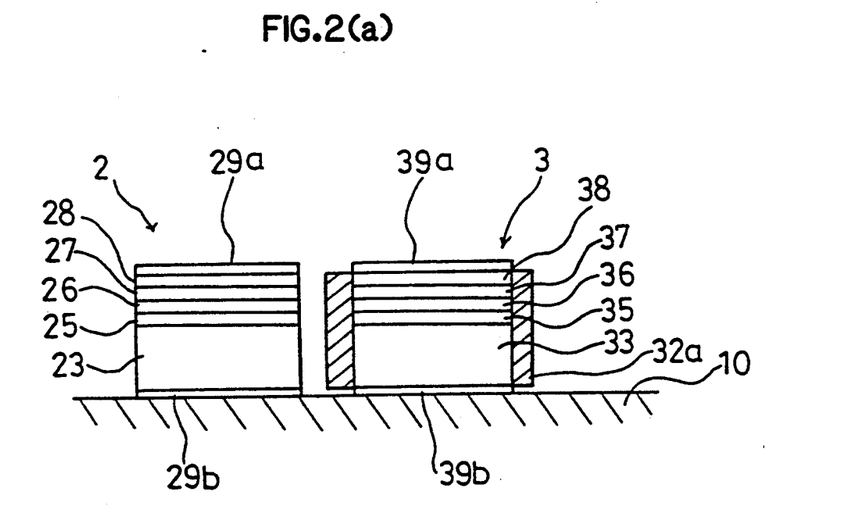
FIG. 2(a) is a diagram showing a hybrid excitation light source.

In addition, the LD amplifier 3 and the semiconductor laser 2 are a hybrid construction produced as separate parts and mounted on a mounting material 10 as shown in FIG. 2(a).

Here, the semiconductor laser 2 has the same structure as the semiconductor laser section 31 of the LD amplifier 3, that is, it comprises an n type InP substrate 23, n type InP cladding layer 25, an InGaAsP layer 26, a p type InP cladding layer 27, a p type InGaAsP layer 28, and a p side electrode 29a and an n side electrode 29b. At the both facets of the semiconductor laser section 31 of the LD amplifier 3, a low reflectance film 32a such as silicon dioxide is produced and the reflectance at the facet thereof is approximately 1%.

Next the function and effect will be described.

When a driving current of approximately 100 mA is applied to the semiconductor laser 2 and the LD amplifier 3, an excited light of wavelength 1.48 microns (approximately 10 to 20 mW) is emitted from the semiconductor laser 2. The excited light is amplified by the LD amplifier 3 to above 100 mW, and is input to the rare-earth doped optical fiber 1 via the coupler 4. Then, an induced emission is generated by the excited light in the optical fiber 1. The signal light 11 is input to the optical fiber 1 via the coupler 4, and is amplified by induced emision.

In this embodiment, since the facet reflectance of the LD amplifier 3 is approximately 1%, the tolerance relating to the refractive index and film thickness of the low reflectance film 32a are loose and a low reflectance film can be produced stably and easily.

In addition, the driving current may be approximately 100 mA for both semiconductor laser 2 and LD amplifier 3, and compared with a case where LD is utilized alone as an excitation light source, a quite high reliability is obtained.

In addition, the superior characteristics of an optical fiber amplifier appears in the characteristics of the output light and a high efficiency such as high gain can be accomplished by an increase of the excitation light power.

Obtaining high performance will be described in detail. Since the LD amplifier 3 has an facet reflectance of 1% and has a residual reflectance, it does not have a complete traveling wave type characteristic but has a resonant type one. Therefore, the band is narrow and a ripple arises in the gain owing to the reflection at the both facets (refer to FIG. 3(g)). However, since the LD amplifier 3 and the semiconductor laser 2 have same structures, a high coupling is obtained and if a forward bias about three times forward bias as the threshold current Ith (approximately 100 mA) is applied to the LD amplifier 3, a gain of above 10 dB is obtained and a light output of above 100 mW is obtained for optical fiber excitation. In addition, the light amplified by such pseudo-traveling wave type LD amplifier generates a ripple in the oscillation spectrum owing to the ripple in the dependency of gain on polarization, that is, arising in the gains of TM mode and TE mode. However, the center wavelength is the same 1.48 microns as the light emitted from the semiconductor laser 2. On the other hand, in the Er doped optical fiber amplifier as shown in FIG. 5, the output characteristics do not depend on the mode of the excited light and has no dependency on polarization.

Accordingly, the excited light has ripples in the oscillation spectrum, but the output light has a wide band and has no dependency on polarization and is above 100 mW, therefore it is possible to obtain a gain of above 20 dB and further since an optical fiber is used as a base, the noise and coupling loss with the transmission line are reduced.

In the above-illustrated embodiment, although the excitation light source has a hybrid LD and LD amplifier, it may construction, it may be monolithic.

Figure 2B:
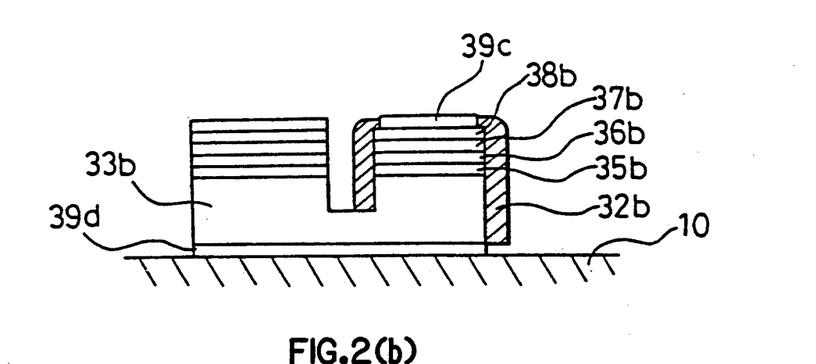
FIG. 2(b) is a diagram showing a monolith excitation light source.

FIG. 2(b) shows another embodiment of the present invention having such monolithic construction. A p type cladding layer 35b, an active layer 36b, an n type cladding layer 37b, and a contact layer 38b are successively produced on a common substrate 33b, and further a p side electrode 39c and an n side electrode 39d are produced. A predetermined region is etched to separate the semiconductor laser side portion and the LD amplifier portion, and a low reflectance film 32b is produced at the both facets of the LD amplifier side.

In this case, in addition to the effects of the above described embodiment, a further higher coupling efficiency and gain are obtained and the optical amplifier itself can be miniaturized by integration.

As is evident from the forgoing description, according to the present invention, an optical fiber amplifier is used as an optical amplifier, an excitation light source of the optical fiber amplifier comprises a semiconductor laser which generates an excited light and a semiconductor laser amplifier which amplifies the excited light. Therefore the superior characteristics of an optical fiber amplifier appears in the output characteristics of the signal light, the dependency of the signal gain on polarization is gone, and the noise and coupling loss with the transmission line are reduced. And as a result, the performance required of the excitation light source is diminished, facet reflectance of the LD amplifier may be approximately 1%, and the production is extremely simplified. In addition, the semiconductor laser and the LD amplifier can be of the same structure and a further simplification of production is attained.

In addition, the optical output of the semiconductor laser itself can be low level and a high reliability is assured. Further, since the excited light is amplified by the semiconductor laser amplifier, the excited light power is increased and increase in gain saturated output, and gain band width are obtained.

What is claimed is:

1. An optical amplifier apparatus for amplifying a signal light in an optical fiber comprising:
   an optical fiber including:
   a core containing a rare-earth dopant element;
   a cladding layer comprising glass covering said core; and
   a protecting film covering said cladding layer;
   an excitation light source for generating an excited light for input to said optical fiber comprising:
   a semiconductor laser for generating the excited light; and
   a semiconductor laser optical amplifier for amplifying the excited light and outputting the amplifier excited light to said optical fiber;
   a coupler for coupling the signal light and the excited light from said optical amplifier; and
   a filter for separating the sight light from the excited light after the signal light and excited light have passed through said optical fiber.

2. An optical amplifier apparatus for amplifying a signal light in an optical fiber comprising:
   an optical fiber having a core containing a rare-earth dopant element; and
   an excitation light source for generating an excited light for input to said optical fiber comprising:
   a semiconductor laser for generating the excited light; and
   a semiconductor laser optical amplifier for amplifying the excited light and outputting the amplified excited light to said optical fiber including:
   a semiconductor substrate on which said semiconductor laser optical amplifier is disposed;
   facets through which light is input and output, and optical waveguide, and a contact layer disposed on said optical waveguide;
   a first electrode disposed on said contact layer;
   a second electrode disposed on said semiconductor substrate opposite said semiconductor laser optical amplifier; and
   a low reflectance film disposed on said facets of said semiconductor laser optical amplifier for reducing the reflectance of said facets wherein said semiconductor laser for generating excited light has the same construction as said semiconductor laser optical amplifier and said semiconductor laser for generating the excited light and said semiconductor laser optical amplifier are commonly mounted.

3. An optical amplifier apparatus for amplifying a signal light in an optical fiber comprising:
   an optical fiber having a core containing a rare-earth dopant element; and
   an excitation light source for generating an excited light for input to said optical fiber comprising:
   a semiconductor laser for generating the excited light; and
   a semiconductor laser optical amplifier for amplifying the excited light and outputting the amplified excited light to said optical fiber wherein said excitation light source comprises said semiconductor laser for generating excited light and said semiconductor laser for optical amplification in a monolithic construction produced by:

producing an optical waveguide, a contact layer, and a first electrode layer successively on a surface of a semiconductor substrate;

producing a second electrode on said semiconductor substrate opposite said optical waveguide;

producing an element separation groove extending through said optical waveguide, contact layer, and first electrode in said substrate; and applying a low reflectance film for reducing reflectance on both facets of said semiconductor laser optical amplifier.

4. An optical amplifier apparatus as defined in claim 2 wherein said optical wave-guide comprises an active layer sandwiched between upper and lower cladding layers.

5. An optical amplifier apparatus as defined in claim 3 wherein said optical wave-guide comprises an active layer sandwiched between upper and lower cladding layers.

6. An optical amplifier apparatus as defined in claim 1 wherein said core is silicon dioxide and contains erbium as a dopant.

* * * * *

UNITED STATES PATENT AND TRADEMARK OFFICE
CERTIFICATE OF CORRECTION

PATENT NO. : 5,101,461

DATED : MARCH 31, 1992

INVENTOR(S) : YASUO NAKAJIMA

It is certified that error appears in the above-identified patent and that said Letters Patent is hereby corrected as shown below:

Claim 1, column 8, line 25, change "sight" to --signal--.

Claim 3, column 9, line 15, change "in" to --into--.

Signed and Sealed this

Twenty-second Day of June, 1993

Attest:

MICHAEL K. KIRK

Attesting Officer

Acting Commissioner of Patents and Trademarks